(12) United States Patent
Rana et al.

(10) Patent No.: US 11,823,948 B2
(45) Date of Patent: *Nov. 21, 2023

(54) BULK WAFER SWITCH ISOLATION

(71) Applicant: GLOBALFOUNDRIES U.S. Inc., Santa Clara, CA (US)

(72) Inventors: Uzma Rana, Slingerlands, NY (US); Anthony K. Stamper, Burlington, VT (US); Steven M. Shank, Jericho, VT (US); Brett T. Cucci, Colchester, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/696,348

(22) Filed: Mar. 16, 2022

(65) Prior Publication Data

US 2022/0208599 A1 Jun. 30, 2022

Related U.S. Application Data

(63) Continuation of application No. 17/069,098, filed on Oct. 13, 2020, now Pat. No. 11,322,387.

(51) Int. Cl.
*H01L 27/00* (2006.01)
*H01L 21/76* (2006.01)
*H01L 27/06* (2006.01)
*H01L 21/762* (2006.01)

(52) U.S. Cl.
CPC ............ *H01L 21/76* (2013.01); *H01L 21/762* (2013.01); *H01L 27/0617* (2013.01)

(58) Field of Classification Search
CPC .... H01L 21/762; H01L 21/76; H01L 27/0617
See application file for complete search history.

(56) References Cited

U.S. PATENT DOCUMENTS

| 5,723,896 | A | 3/1998 | Yee et al. |
| 6,228,766 | B1 | 5/2001 | Fujii |
| 6,344,679 | B1 * | 2/2002 | Klaasen .............. H01L 23/5254 |
| | | | 365/96 |
| 7,772,083 | B2 | 8/2010 | Botula et al. |
| 8,089,126 | B2 | 1/2012 | Botula et al. |
| 8,299,537 | B2 | 10/2012 | Greco et al. |

(Continued)

FOREIGN PATENT DOCUMENTS

GB 2108761 A * 5/1983 ........... H01L 21/268

OTHER PUBLICATIONS

Fourre, et al., "Implant isolation for lattice matched InGaAs/InAlAs/InP modulation doped field effect transistor realisation", IEEE Xplore, Proceedings of 8th International Conference on Indium Phosphide and Related Materials, Apr. 21-25, 1996, Schwabisch-Gmund, Germany, 3 pages.

*Primary Examiner* — Reema Patel
(74) *Attorney, Agent, or Firm* — Anthony Canale; Andrew M. Calderon; Calderon Safran & Cole P.C.

(57) ABSTRACT

The present disclosure relates to semiconductor structures and, more particularly, to bulk wafer switch isolation structures and methods of manufacture. The structure includes: a bulk substrate material; an active region on the bulk substrate material; an inactive region adjacent to the active region; and an amorphous material covering the bulk substrate material in the inactive region, which is adjacent to the active region.

18 Claims, 4 Drawing Sheets

(56) References Cited

U.S. PATENT DOCUMENTS

| | | |
|---|---|---|
| 9,048,285 B2 | 6/2015 | Chen et al. |
| 9,177,852 B2 | 11/2015 | Steeneken et al. |
| 10,192,781 B2 | 1/2019 | Nitta et al. |
| 10,319,716 B2 | 6/2019 | Moen et al. |
| 10,483,155 B2 | 11/2019 | Bhattacharyya |
| 11,322,387 B1 * | 5/2022 | Rana .................... H01L 21/762 |
| 2005/0098847 A1 * | 5/2005 | Chen .................. H01L 29/8611 |
| | | 257/E29.328 |
| 2009/0101979 A1 | 4/2009 | Kim et al. |

\* cited by examiner

BULK WAFER SWITCH ISOLATION

FIELD OF THE INVENTION

The present disclosure relates to semiconductor structures and, more particularly, to bulk wafer switch isolation structures and methods of manufacture.

BACKGROUND

Semiconductor devices can be fabricated on many different types of substrates depending their specific applications. For example, depending on the particular application, e.g., targeted RF performance, linearity and harmonics, a designer may select a substrate ranging from standard Silicon-on-Insulator (SOI), high-resistivity (HR) SOI, trap rich HR SOI technologies, as well as non-SOI trap rich wafers.

Non-SOI trap rich wafers are attractive alternatives due to their cost effectiveness. Non-SOI trap rich wafers, though, provide poor switching capabilities and poor coplanar waveguide linearity due to presence of dummy fill field effect transistor (FET) shapes. To address the issues of poor linearity (e.g., interference distortion) and harmonics, manufacturers have turned to trap rich HR SOI technologies. For example, HR SOI technologies provide larger bandwidths for higher frequency bands and data-rate protocols. Also, for RF devices, the insulated substrate of SOI technologies enables stacked FET transistors to handle a high voltage swing at high power output incident at the antenna, and the reduced substrate coupling minimizes the insertion loss and improves linearity such as harmonics. But, these alternative technologies come at a considerable expense.

SUMMARY

In an aspect of the disclosure, a structure comprises: a bulk substrate material; an active region on the bulk substrate material; an inactive region adjacent to the active region; and an amorphous material covering the bulk substrate material in the inactive region, which is adjacent to the active region.

In an aspect of the disclosure, a structure comprises: a single crystalline bulk substrate; an active region with active devices located on the single crystalline bulk substrate; an inactive region separated from the active region by shallow trench isolation structures; and an amorphous layer on the single crystalline bulk substrate in the inactive region.

In an aspect of the disclosure, a method comprises: forming active devices on a substrate in an active region; forming inactive devices over the substrate in an inactive region; removing the inactive devices and exposing the substrate in the inactive region; damaging the exposed substrate in the inactive region; and forming a dielectric material over the active devices and the damaged exposed substrate in the inactive region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to bulk wafer switch isolation structures and methods of manufacture. More specifically, the present disclosure relates to middle of line (MOL) low energy argon bulk wafer switch isolation structures. Advantageously, the present disclosure increases the resistive surface of a bulk wafer substrate which, in turn, improves switching linearity and harmonics of the substrate. In addition, the present disclosure eliminates the need for a high energy high dose Argon implant for MOL structures.

In embodiments, the bulk wafer switch isolation structures are provided in inactive areas, e.g., white spaces, of an integrated circuit (IC) chip. The method of fabrication includes exposing a substrate (silicon) in an inactive region of the IC chip by removal of dummy structures, followed by performing a low energy Ar implant to amorphize the exposed portions of the substrate. To expose the substrate, shallow trench isolation features and dummy gate structures, e.g., inactive FETs after silicide formation, can be removed within the inactive areas. The fabrication method creates a bulk wafer isolation structure, at a low cost, without affecting other structures and surfaces within the active area of the IC chip. Also, the amorphized silicon substrate will provide isolation for adjacent active regions (e.g., radio frequency (RF) FETs).

The bulk wafer switch isolation structures of the present disclosure can be manufactured in a number of ways using a number of different tools. In general, though, the methodologies and tools are used to form structures with dimensions in the manufacture the bulk wafer switch isolation structures of the present disclosure have been adopted from integrated circuit (IC) technology. For example, the structures are built on wafers and are realized in films of material patterned by photolithographic processes on the top of a wafer. In particular, the fabrication of the bulk wafer switch isolation structures uses three basic building blocks: (i) deposition of thin films of material on a substrate, (ii) applying a patterned mask on top of the films by photolithographic imaging, and (iii) etching the films selectively to the mask.

Figure 1A:
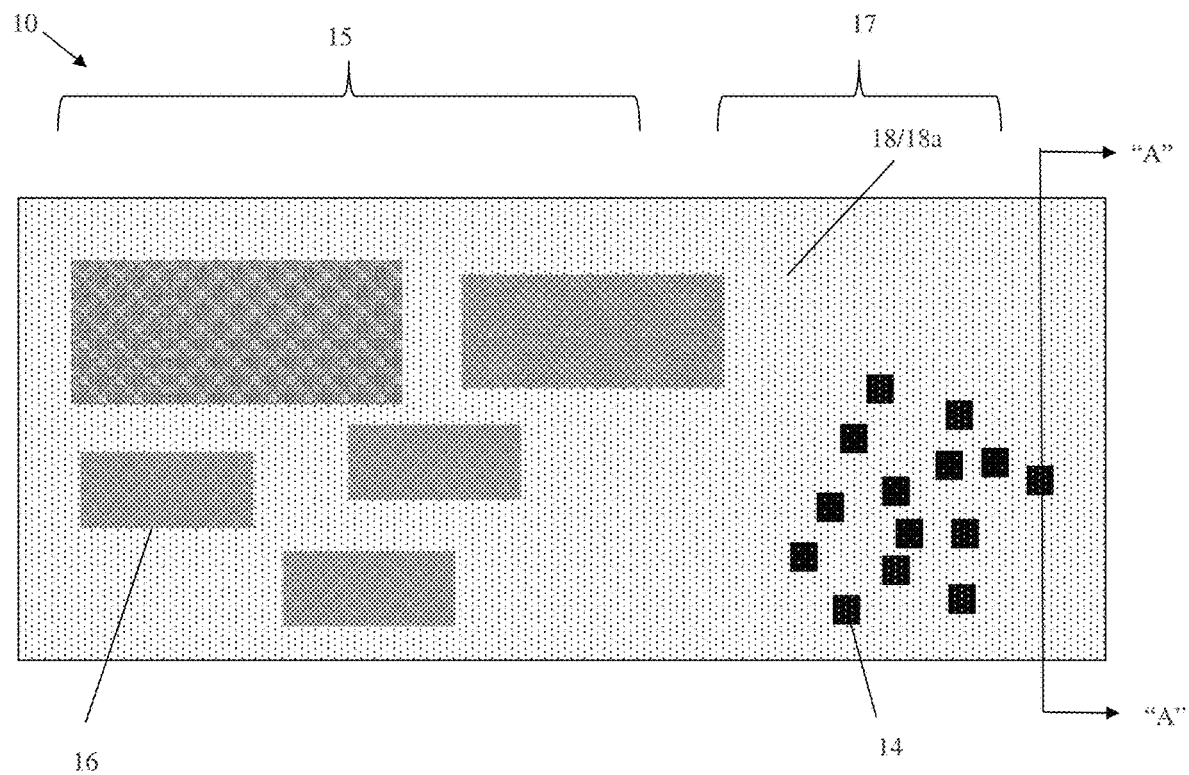
FIG. 1A shows a top view of an active region and inactive region of an integrated circuit (IC), amongst other features, and respective fabrication processes in accordance with aspects of the present disclosure.
Figure 1B:
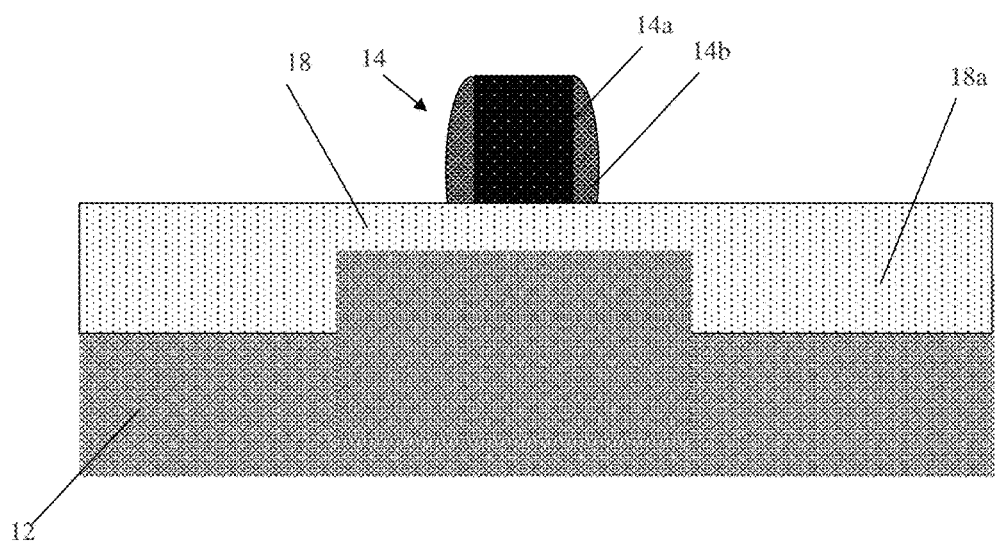
FIG. 1B is a cross-sectional view of the inactive region of FIG. 1A, along line A-A.

FIG. 1A shows a top view of an active region and inactive region of an integrated circuit (IC), and respective fabrication processes in accordance with aspects of the present disclosure. FIG. 1B is a cross-sectional view of the inactive region of FIG. 1A, along line A-A. More specifically and referring to both FIGS. 1A and 1B, the structure 10 includes a substrate 12 with active regions 15 and inactive regions 17. The substrate 12 is a bulk substrate composed of any suitable material. For example, the substrate 12 includes a bulk semiconducting material such as single crystalline silicon. Alternatively, the substrate 12 may comprise other suitable bulk elementary semiconducting materials such as germanium in crystal; a compound semiconductor, such as silicon carbide, silicon germanium, gallium arsenic, gallium phosphide, indium phosphide, indium arsenide, indium antimonide, combinations thereof, or other III/V or II/VI compound semiconductors.

In embodiments, the active regions 15 include devices 16; whereas, the inactive regions (e.g., white space) 17 include dummy gate structures 14. The devices 16 can be gate structures (e.g., transistors) which include dimensions similar to that of the dummy gate structures 14. The devices 16 and dummy gate structures 14 are surrounded by shallow trench isolation structures 18a, and the dummy gate structures 14 can be formed on insulator material 18. The shallow trench isolation structures 18a and insulator material 18 can be an oxide material (e.g., $SiO_2$), deposited using conventional deposition methods, e.g., chemical vapor deposition (CVD) process. The dummy gate structures 14 include a dummy poly material 14a and sidewall spacers 14b.

Although not critical to the understanding of the present disclosure, the devices 16 (e.g., gate structures) and dummy gate structures 14 can be fabricated using conventional CMOS processes. For example, the devices 16 and dummy gate structures 14 can be fabricated using standard CMOS or replacement gate processes using. In the standard CMOS processing, a gate dielectric and polysilicon are formed, e.g., deposited, onto the substrate material 18, followed a patterning process. An insulator material such as nitride or oxide can be deposited on the patterned materials, followed by an anisotropic etching process to form sidewalls.

In a replacement gate process, for example, sacrificial material, e.g., polysilicon material, is deposited on the insulator material 18 (for dummy structures) and substrate material 18 (for active devices). The gate dielectric material and sacrificial material are patterned using conventional lithography and etching (reactive ion etching processes). Sidewall material (e.g., nitride) is blanket deposited on the patterned gate dielectric material and sacrificial material, followed by an anisotropic etching process to form sidewall spacers. The fabrication process will result in dummy gate structures 14 comprising, e.g., the sacrificial material 14a and the sidewall spacers 14b.

After additional processing is performed for other features, e.g., well implants, source/drain features, silicide processes, etc., the sacrificial material for the active device formation can be removed with a selective etch chemistry, while protecting the dummy gate structures 14 with a masking material known in the art such that no further explanation is required for a complete understanding of the disclosure. In embodiments, the etching process will not erode or remove the sidewalls and gate dielectric material. The removal of the sacrificial material will leave an opening between the sidewall spacers, which is filled with dielectric material and workfunction metals to form the active devices 16.

Figure 2:
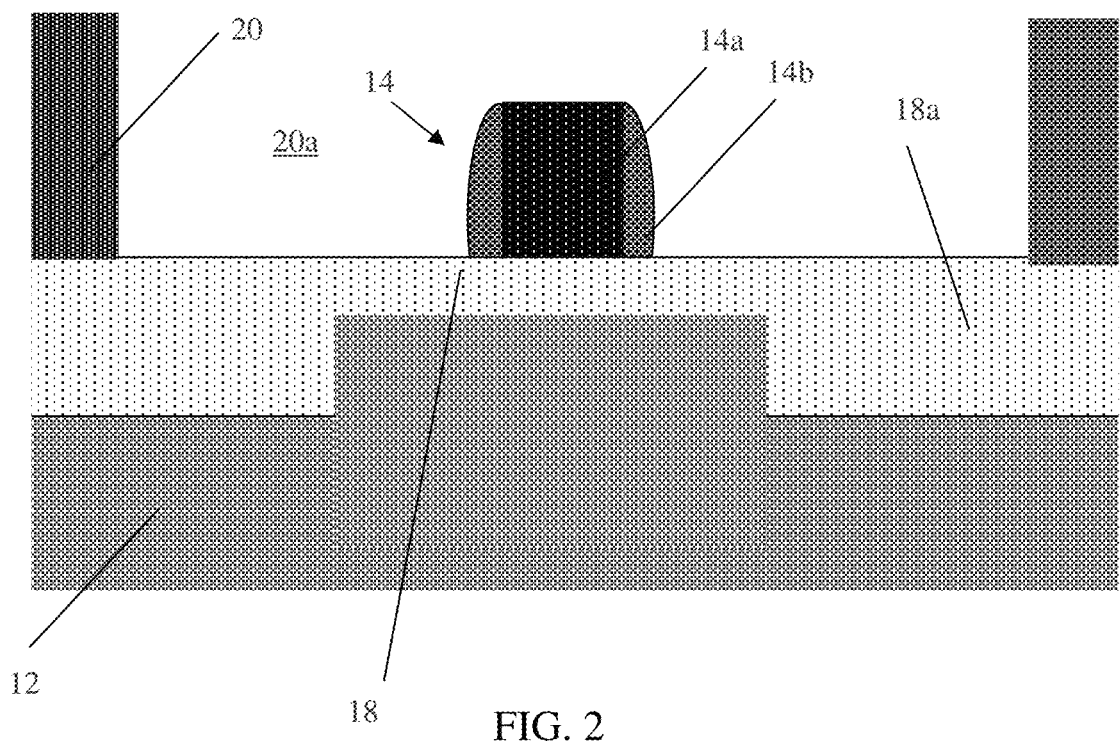
FIG. 2 shows a patterned mask over a dummy gate structure located in the inactive region, amongst other features, and respective fabrication processes in accordance with aspects of the present disclosure.

FIG. 2 shows a patterned mask 20 over the dummy gate structure(s) 14 located within the inactive region(s). The mask 20 can be any standard lithography mask used in conventional etching processes. FIG. 2 illustratively shows that the mask 20 is patterned to include an opening 20a which exposes a single dummy gate structure 14; however, it should be understood by those of skill in the art that the opening 20a can include exposure of any number of dummy gate structures 14 within the inactive regions of the substrate, e.g., IC.

In embodiments, the opening 20a of the mask 20 can be formed by any conventional lithography and etching methods known to those of skill in the art. For example, a resist formed over the mask 20 is exposed to energy (light) to form a pattern (opening). An etching process with a selective chemistry, e.g., reactive ion etching (RIE), will be used to form one or more opening(s) 20a in the mask 20 through the openings of the resist. The opening 20a will expose one or more of the dummy gate structures 14. The resist can then be removed by a conventional oxygen ashing process or other known stripants.

Figure 3:
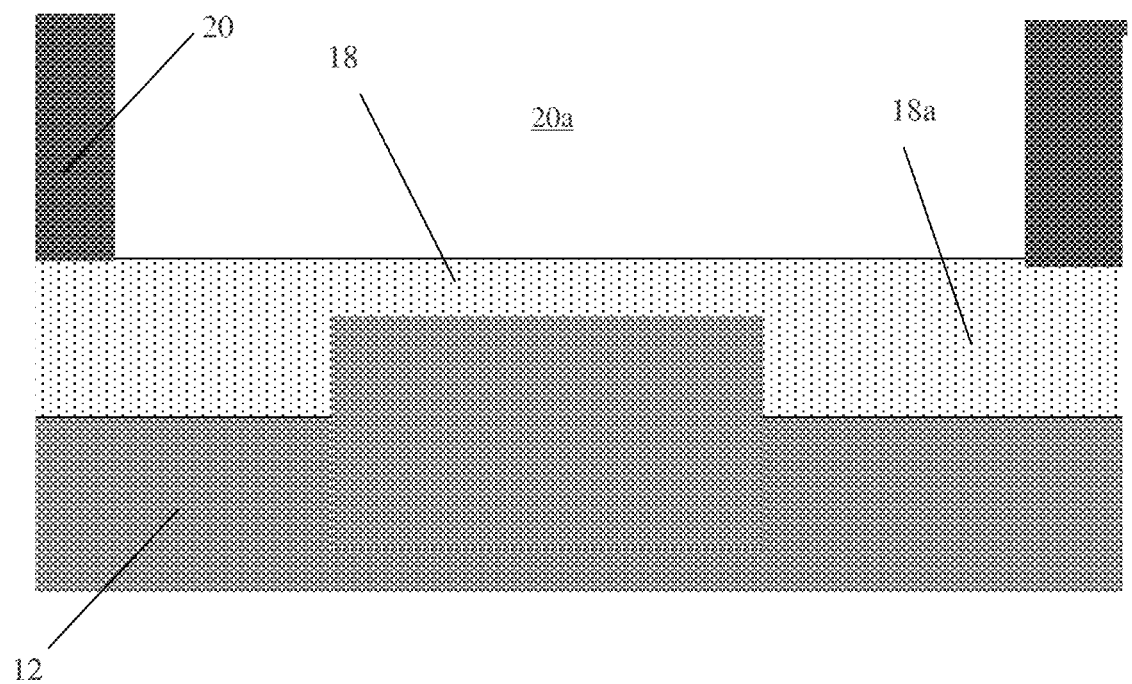
FIG. 3 shows the dummy gate structure removed from the inactive region, amongst other features, and respective fabrication processes in accordance with aspects of the present disclosure.

As shown in FIG. 3, following the resist removal, the dummy gate structure(s) 14 can be removed from the inactive regions. The dummy gate structure(s) 14 can be removed by conventional etching processes (RIE) with selective chemistries or wet chemistries. The sidewall spacers 14b can be removed by a dry etching process or hot phosphorus and dilute HF solution, as examples. The etching process will expose the underlying insulator material 18 and shallow trench isolation structures 18a in the inactive regions.

Figure 4:
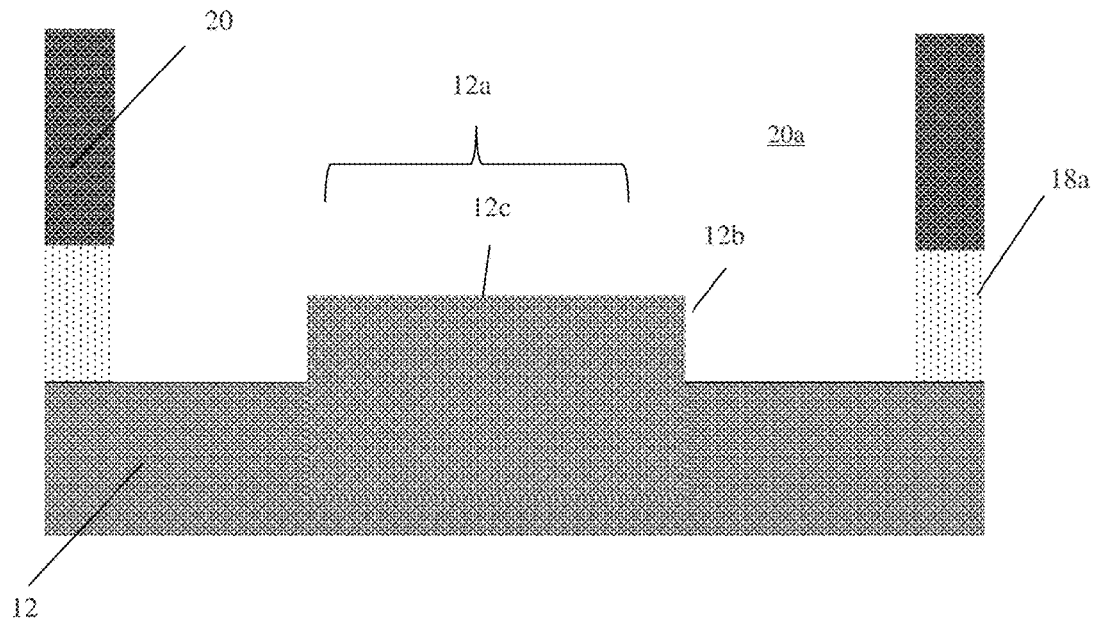
FIG. 4 shows an exposed substrate material in the inactive region, amongst other features, and respective fabrication processes in accordance with aspects of the present disclosure.

FIG. 4 shows an exposed substrate material 12 in the inactive region(s), amongst other features, and respective fabrication processes. For example, in the fabrication processes to expose the substrate material 12, the exposed portions of the insulator material 18 and shallow trench isolation structures 18a can be removed using oxide etching processes known to those of skill in the art. For example, the oxide etching process can include a wet etchant, e.g., HF etch, which uses a chemical process rather than a dry plasma process. By removing the exposed insulator material 18 and shallow trench isolation structures 18a, a stepped feature 12a is formed in the substrate 12, which includes sidewalls 12b and a top, upper surface 12c.

Figure 5:
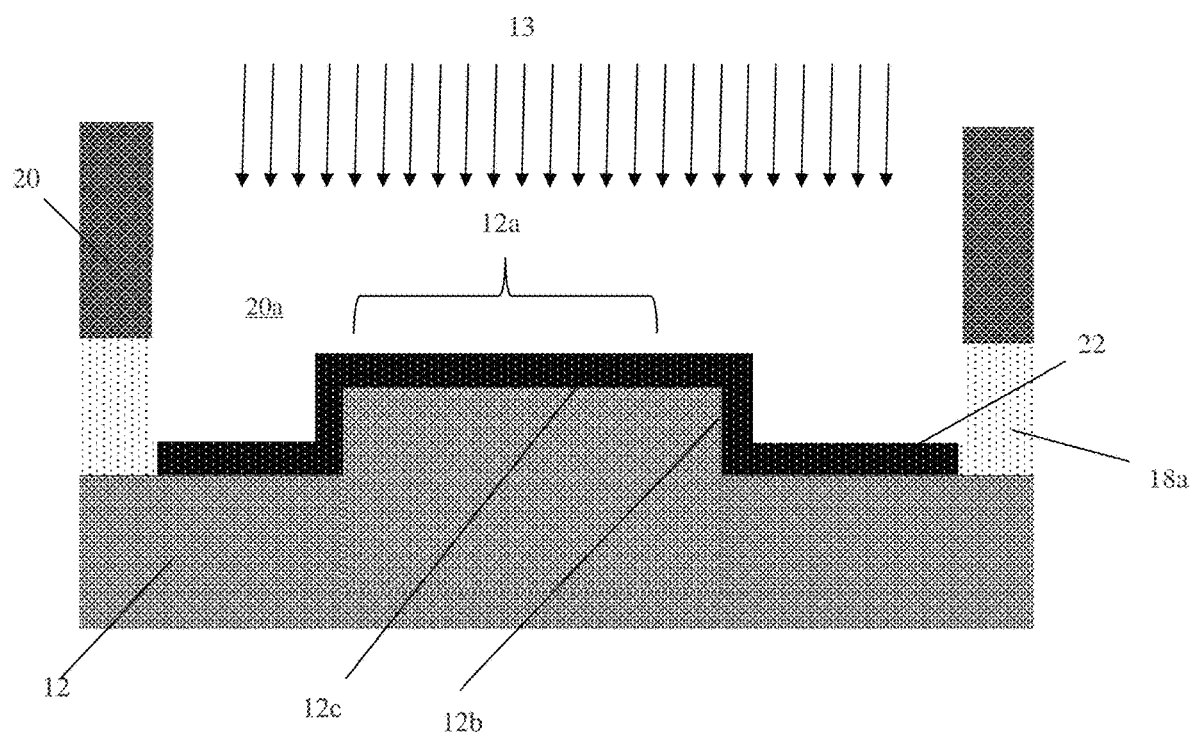
FIG. 5 shows amorphized substrate material in the inactive region, amongst other features, and respective fabrication processes in accordance with aspects of the present disclosure.

FIG. 5 shows amorphized substrate material 22, amongst other features, and respective fabrication processes. In this processing step, the exposed substrate material 12, including the stepped features 12a, is subjected to an implant process shown by arrows labeled with reference numeral 13, which damages the substrate material 12, e.g., amorphizes crystalline substrate material. Preferably, in this implementation process, the mask 20 is an implantation mask which may include a layer of a light-sensitive material, such as an organic photoresist, applied by a spin coating process, pre-baked, exposed to light projected through a photomask, baked after exposure, and developed with a chemical developer. The mask has a thickness and stopping power sufficient to block masked areas against receiving a dose of the implanted ions.

Still referring to FIG. 5, in embodiments, the implant process includes an argon implant process at a low dose and energy (e.g., eliminates the need for a standard high energy high dose Argon implant). For example, the argon implant can be at a dose of 30 Key to 500 Key (compared to a standard implantation dosage of about 900 Key), and the energy can be at 1e14 to 1e15 (compared to a standard energy of 1e16). In further embodiments, to ensure complete coverage, the implant process can be performed using a quad implant process, e.g., at about 7 degrees. The quad implant process includes dividing the desired dose into four equal portions, and then repositioning the wafer between each implantation segment. This allows shadowing effects resulting from zero tilt to be symmetric around the device features.

As should be understood, the implant process will damage the substrate material 12 resulting in an amorphous Si material 22. The amorphous Si material 22 will effectively coat or cover the crystalline (or defect free) substrate material 12, and will have a higher resistivity than the substrate material 12. By way of example, the energy level of the argon implantation can be in the range of 200 Kev-900 Kev resulting in a thickness of amorphous material 22 of about 50 nm. The mask 20 can be removed following the implant process.

Figure 6:
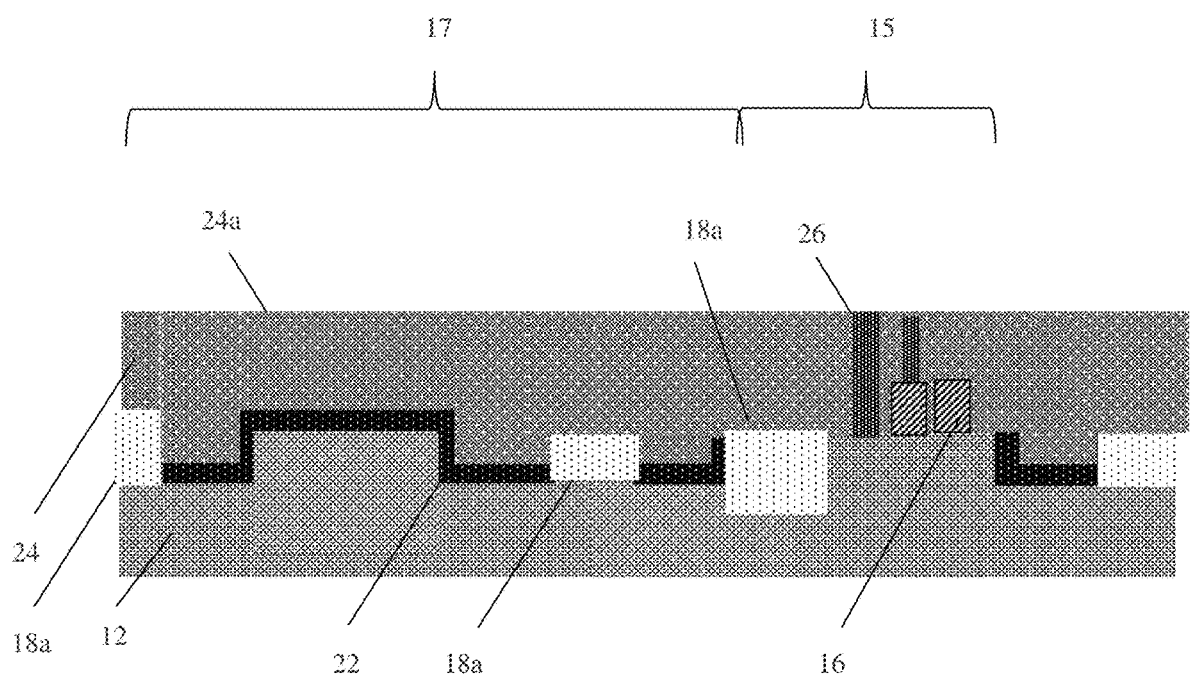
FIG. 6 shows dielectric material over the active region and inactive region, amongst other features, and respective fabrication processes in accordance with aspects of the present disclosure.

FIG. 6 shows a dielectric material 24 over the active region 15 and inactive region 17, amongst other features. More specifically, in FIG. 6, the dielectric material 24 can be boron silica glass (BSG) deposited using a conventional conformal deposition method, e.g., CVD. The dielectric material 24 will cover the amorphous material 22 in the inactive region 17, as well as the active devices 16 in the active region 15. The amorphous material 22 will not be recrystallized, remaining in an amorphous state. Also, the active devices in the active region 15 are on a same level as the amorphous material 22 in middle of the line structures. In this and similar structures using the amorphous material 22, the amorphous material 22 will provide switch isolation; that is, the use of amorphous material 22 improves switching linearity and harmonics due to an increase in resistivity of the substrate 12.

Still referring to FIG. 6, the dielectric material 24 is planarized by a chemical mechanical polishing (CMP) method to form a planar surface 24a. Contacts 26 can be formed to the active devices, e.g., transistors, and its source drain regions though the dielectric material 24. The contacts 26 are formed by conventional lithography, etching and deposition methods. For example, after forming and patterning a resist mask, a trench is formed in the dielectric material 24 to expose the active devices and source and drain regions. A metal or metal alloy material is deposited within the trenches. The metal can be aluminum, as an example. Any excessive material on the dielectric material 24 can be removed by a CMP process.

The bulk wafer switch isolation structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   an active region on a substrate material;
   an inactive region adjacent to the active region; and
   an amorphous material covering the substrate material in the inactive region,
   wherein the active region is devoid of the amorphous material under active devices in the active region.

2. The structure of claim 1, wherein the amorphous material is a layer of defective bulk substrate material.

3. The structure of claim 2, wherein the amorphous material has a higher resistivity than the substrate material.

4. The structure of claim 3, wherein the amorphous material in the inactive region includes a stepped feature between shallow trench isolation structures.

5. The structure of claim 4, wherein the stepped feature includes the substrate material under the amorphous material.

6. The structure of claim 1, wherein the substrate material is single crystalline Si material and the amorphous material is a defective layer of the single crystalline Si material.

7. The structure of claim 1, wherein the amorphous material is provided between shallow trench isolation structures.

8. The structure of claim 1, further comprising active devices in the active region, and wherein the amorphous material provides substrate isolation for the active devices in the active region.

9. The structure of claim 8, further comprising dielectric material covering the active devices and the amorphous material in the inactive region.

10. The structure of claim 9, wherein the inactive region which includes the amorphous material is devoid of dummy gate structures.

11. The structure of claim 8, wherein the active devices in the active region are on a same level as the amorphous material.

12. A structure comprising:
    a single crystalline bulk substrate;
    an active region in the single crystalline bulk substrate;
    an inactive region separated from the active region; and
    an amorphous layer comprising defective single crystalline bulk substrate in the inactive region, and wherein the active region is devoid of the amorphous layer under active devices within the active region.

13. The structure of claim 12, wherein the amorphous layer includes a stepped feature between shallow trench isolation structures.

14. The structure of claim 13, wherein the stepped feature includes the single crystalline bulk substrate under the amorphous layer.

15. The structure of claim 12, wherein the inactive region is devoid of dummy gate structures.

16. The structure of claim 12, further comprising dielectric material covering the active region and the amorphous layer in the inactive region.

17. The structure of claim 12, wherein active devices in the active region are on a same level as the amorphous layer in the inactive region.

18. A structure comprising:
   an active region on substrate material;
   an inactive region adjacent to the active region; and
   an amorphous material in the inactive region which provides substrate isolation for active devices in the active region, wherein the active region under the active devices is devoid of the amorphous material.

\* \* \* \* \*